(12) United States Patent
Lee

(10) Patent No.: US 6,469,565 B1
(45) Date of Patent: Oct. 22, 2002

(54) DUTY CYCLE ADAPTIVE DATA OUTPUT BUFFER

(75) Inventor: Chul-kyu Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 207 days.

(21) Appl. No.: 09/637,547

(22) Filed: Aug. 11, 2000

Related U.S. Application Data

(63) Continuation of application No. 09/069,535, filed on Apr. 29, 1998, now Pat. No. 6,127,861.

(30) Foreign Application Priority Data

Apr. 4, 1997 (KR) .............................................. 97-16609

(51) Int. Cl.[7] .............................................. H03K 17/04
(52) U.S. Cl. ........................ 327/374; 327/404; 326/85
(58) Field of Search .................................. 327/108, 111, 327/112, 374, 376, 384, 382, 403, 404, 434; 326/26, 27, 87, 91, 85

(56) References Cited

U.S. PATENT DOCUMENTS

| | | | | |
|---|---|---|---|---|
| 5,153,450 A | * | 10/1992 | Ruetz | 307/443 |
| 5,489,859 A | * | 2/1996 | Kawaguchi et al. | 326/57 |
| 5,528,166 A | * | 6/1996 | Iikbahar | 326/27 |
| 6,127,861 A | * | 10/2000 | Lee | 327/112 |

\* cited by examiner

*Primary Examiner*—Jung Ho Kim
(74) *Attorney, Agent, or Firm*—Marger Johnson & McCollm, P.C.

(57) ABSTRACT

The present invention relates to a duty cycle adaptive data output buffer of a semiconductor device in which the current driving power of the output buffer is adaptively varied with a duty cycle, to effectively improve noise margin at slow duty cycle. The duty cycle adaptive data output buffer disclosed includes first and second pull-up transistors connected between a power supply voltage and an output terminal; first and second pull-down transistors connected to the output terminal and a ground; duty cycle detector for receiving a duty clock signal, to generate a first control signal at faster duty cycle, and to generate a second control signal at slower duty cycle; a first output driver for driving the first pull-up and pull-down transistors using first and second data signals in response to the first control signal; and a second output driver for driving the second pull-up and pull-down transistors using the first and second data signals in response to the second control signal.

8 Claims, 5 Drawing Sheets

DUTY CYCLE ADAPTIVE DATA OUTPUT BUFFER

This application is a continuation of Ser. No. 09/069,535, filed Apr. 29, 1998, U.S. Pat. No. 6,127,861.

BACKGROUND OF THE INVENTION

1. Field of the Invention

The present invention relates to a data output buffer of a semiconductor device and, more particularly, to a duty cycle adaptive data output buffer in which current driving power of an output buffer is adaptively varied with a duty cycle, to effectively improve its noise margin at slow duty cycle.

2. Description of Related Art

A synchronous dynamic random access memory (SDRAM) which operates in synchronization with a system clock signal SC generally has an access time and duty cycle (for example, cycle frequency of system clock signal SC: 66 MHz, 100 MHz, 120 MHz, 150 MHz . . . ) faster than those of a conventional DRAM. To achieve a faster duty cycle and access time, a conventional data output buffer is constructed in such a manner that the last output driver for driving an external capacitive load of a semiconductor device chip has a large channel width (for example, channel width is 500 $\mu$m or more), to make the edge slope of the last data output steeply inclined.

FIG. 1 shows the data output buffer of a conventional semiconductor device. Referring to FIG. 1, a pull-up driver 10 connected between a power supply voltage VDD and an output terminal Dout, and a pull-down driver 9 connected between the output terminal Dout and a ground VSS include NMOS transistors N1 and N2 respectively. The pull-up driver 10 and the pull-down driver 9 are driven by using data signals D and DB internally sensed in the chip through NAND gates NA1 and NA2 and inverters INV3 and INV4, in response to an output enable signal φ TRST. The Data signals D and DB internally sensed in the chip are applied to the gates of the transistors N1 and N2 when the output enable signal φ TRST is in HIGH state, so as to be output from the output terminal Dout according to the operation of the pull-up and pull-down drivers 10 and 9.

In the above-described conventional data output buffer, for the purpose of covering low-frequency and high-frequency operation regions to satisfy a target operation speed required when the output buffer is operated at high frequency, the size of the drivers is fixed to the size of the pull-up and pull-down drivers for high frequency. Accordingly, the size of the output drivers will support the highest frequency so that the channel width of the NMOS transistors N1 and N2 may be fixed.

With the conventional data output buffer, the output driver is operated fast when the data output buffer is operated at lower frequency. However, due to large-size NMOS transistors N1 and N2, a large amount of current is transmitted through the power supply voltage VDD and the ground voltage VSS in a short period time according to fast slope (or transition) of the data output signal Dout when the data output signal Dout is output. This causes overshooting or undershooting of the power supply voltage VDD and the ground voltage VSS. The overshooting and undershooting affect the DC noise margin in the chip. This problem is also generated when the output buffer is operated at higher frequency. Accordingly, in the conventional data output buffer, when the size of the transistor is large in order to meet the high-speed operation, the power noise margin is strictly restricted when the data output buffer is operated at slower speed.

SUMMARY OF THE INVENTION

An object of the present invention is to provide a data output buffer having output drivers whose sizes are adaptively varied with a duty cycle, and thus improve the noise margin using a small-size output driver at lower duty cycle, and to satisfy fast operation speed using a large-size output driver at higher duty cycle.

To accomplish the above-discussed object as well as others, this invention is a data output buffer and method for operating a buffer which includes a duty cycle detection unit which receives a duty clock signal and different control signals to reflect the speed of the duty cycles. For example, if the speed of the duty cycle is fast, the control signal is of a first type to active a large output driver. If the speed of the duty cycle is slow, the control signal of a second type to active a smaller output driver. Thus, the speed requirements of the data buffer will dictate the size of the output driver adapting such accordingly.

The buffer of this invention further includes first and second pull-up transistors connected between a power supply voltage and an output terminal;

first and second pull-down transistors connected to the output terminal and a ground;

first output driver means for driving the first pull-up and pull-down transistors using first and second data signals in response to the first control signal; and second output driver for driving the second pull-up and pull-down transistors using first and second data signals.

Other manners in which accomplish the above-described object, as well as others are described in detail below.

BRIEF DESCRIPTION OF THE DRAWINGS

The above objects, other features and advantages of the present invention will become more apparent by describing a preferred embodiment thereof with reference to the accompanying drawings in which.

DETAILED DESCRIPTION OF PREFERRED EMBODIMENTS

Reference will now be made in detail to the preferred embodiments of the present invention, examples of which are illustrated in the accompanying drawings.

Figure 1:
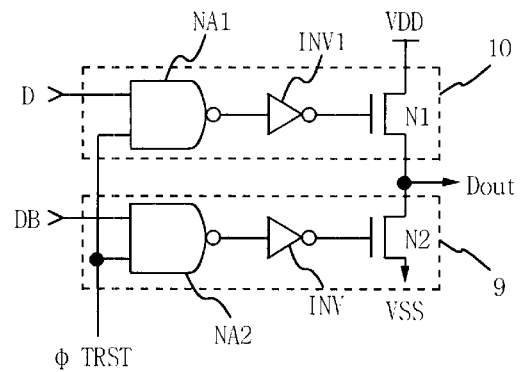
FIG. 1 is a circuit diagram showing the data output buffer of a conventional semiconductor device.
Figure 2:
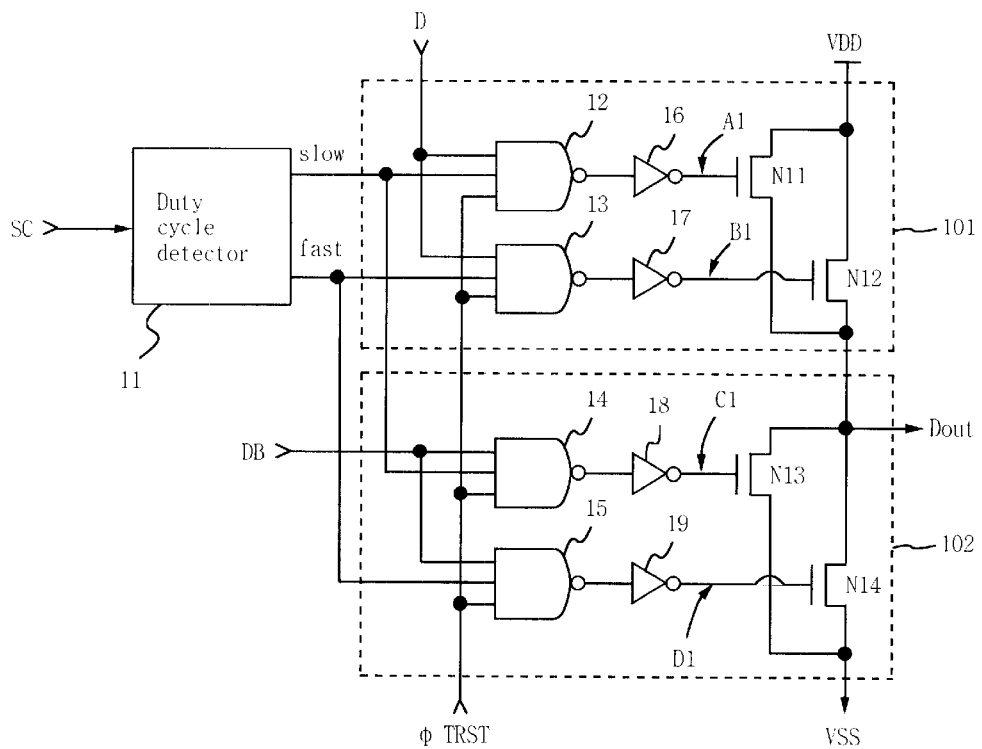
FIG. 2 is a circuit diagram showing a duty cycle adaptive data output buffer according to a first embodiment of the present invention.

FIG. 2 shows the configuration of a data output buffer of a semiconductor device according to a first embodiment of the present invention. Referring to FIG. 2, the data output buffer includes a pull-up driver 101 and a pull down driver 102. These include first and second pull-up transistors N11 and N12 connected between a power supply voltage VDD and an output terminal Dout; and first and second pull-down transistors N13 and N14 connected between the output terminal Dout and a ground VSS. Furthermore, the data output buffer includes a duty cycle detector 11 for receiving a duty clock signal SC, to generate a first control signal (fast) at faster duty cycle, and to also generate a second control signal (slow) at slower duty cycle; first output drivers 13, 17, 15 and 19 for driving the first pull-up and pull-down transistors N12 and N14 using first and second data signals D and DB in response to the first control signal; and second output drivers 12, 16, 14 and 18 for driving the second pull-up and pull-down transistors N11 and N13 using the first and second data signals D and DB in response to the second control signal.

The output buffer is constructed in such a manner that the size of the first pull-up and pull-down transistors N12 and N14 is larger than that of the second pull-up and pull-down transistors N11 and N13 to achieve faster slope of the output data at faster duty cycle. Meanwhile, the second pull-up and pull-down transistors N11 and N13 also have size sufficient to satisfy a desired access time at an appropriate duty cycle.

Figure 4:
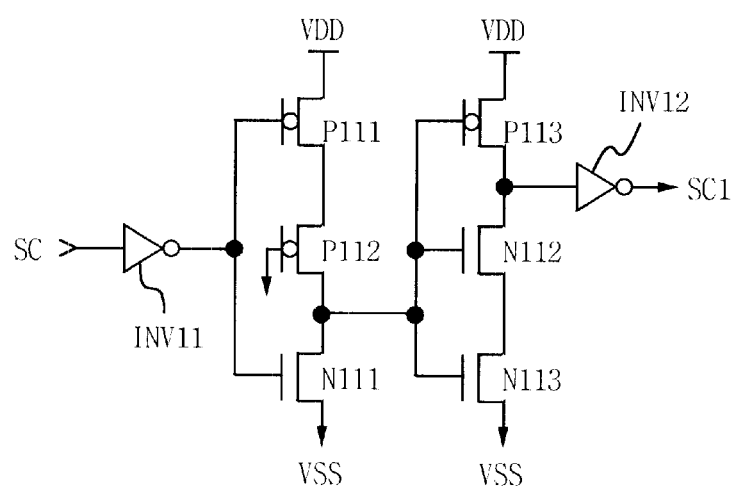
FIG. 4 is a circuit diagram showing an embodiment of the delay of FIG. 3.

Referring to FIG. 4, the delay unit 11A includes, for example, an inverter INV11 for inverting the input signal SC, a PMOS transistor P111 having a gate which receives the output signal of the inverter INV11 with its source is connected to the power supply voltage, and a NMOS transistor N111 having a gate which receives the output signal of the inverter INV11 with its source is connected to the ground. Furthermore, the delay unit 11A includes a PMOS transistor P112 having a gate connected to the ground, with its source connected to the drain of the PMOS transistor P1 and its drain connected to the drain of the NMOS transistor N11. Moreover, the delay unit includes a PMOS transistor P113 having a gate which receives the drain output signal of the NMOS transistor N111, with its source connected to the power supply voltage, and an NMOS transistor N113 having a gate which receives the drain output signal of the NMOS transistor N111 with its source connected to the ground. Additionally, the delay unit includes an NMOS transistor N112 having a gate which receives the drain output signal of the NMOS transistor N111, with its source connected to the drain of the NMOS transistor N113, and its drain connected to the drain of the PMOS transistor P113, and an inverter INV12 for inverting the drain output signal of the NMOS transistor N112. The delay unit 11A serves to control the delay time by setting the turn-on resistance of the PMOS transistor P112 and the NMOS transistor N112. Accordingly, it is possible to set the duty cycle of the semiconductor device by controlling the delay time.

Figure 5A:
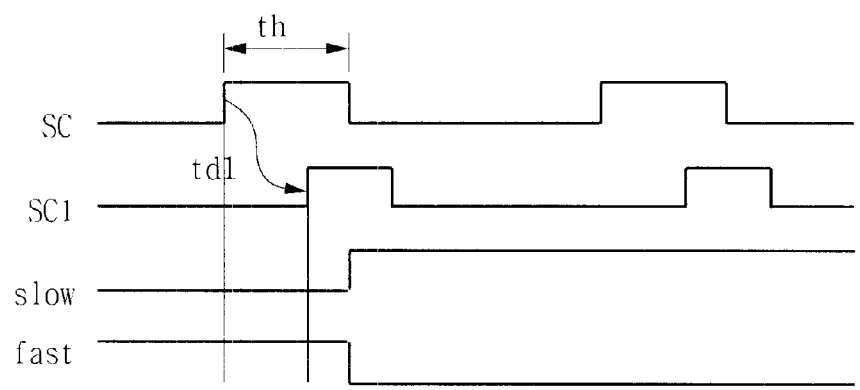
FIG. 5A is a waveform diagram of a frequency detector operated at slower duty cycle.

Referring to FIG. 5A, when the HIGH-state period of the duty clock signal SC is longer than a delay time td1 set to the rising edge of the duty clock signal SC, the second control signal (slow) in a HIGH state and the first control signal (fast) in a LOW state are output at the falling edge of the duty clock signal. Accordingly, the duty cycle of the semiconductor device is detected as being slower than a predetermined value. This predetermined value may be a normal threshold value or another predetermined value.

Figure 5B:
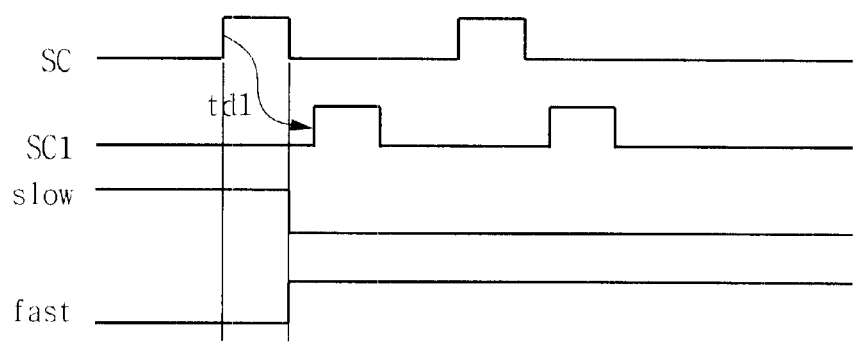
FIG. 5B is a waveform diagram of a frequency detector operated at faster duty cycle.

Referring to FIG. 5B, when HIGH-state period of the of the duty clock signal SC is shorter than the delay time td1 set to the rising edge of the duty clock signal SC, the second control signal (slow) in a LOW state, and the first control signal (fast) in a HIGH state are output at the falling edge of the duty clock signal. Accordingly, the duty cycle of the semiconductor device is detected as being faster than the predetermined value.

Referring back to FIG. 2, internal data signals D and DB which are sensed in the chip are transmitted to the gates of the pull-up transistors N11 and N12, and the pull-down transistors N13 and N14 through NAND gates 12 to 15 and inverters 16 to 19, according to the second and first control signals internally generated by the duty cycle detector 11 in the chip, and HIGH state of the output enable signal φTRST. By doing so, data signals D and DB appear at the output terminal in HIGH or LOW state according to the data value.

Accordingly, in this embodiment of the present invention, since the first control signal (fast) is activated by the duty cycle detector 11 when the duty cycle of the semiconductor device is faster than a predetermined value, the data signal is applied to the gates of large-size first pull-up and pull-down transistors N12 and N14 through the NAND gates 13 and 15, and the inverters 17 and 19, to form an output signal from the output terminal rapidly.

On the other hand, when the duty cycle of the semiconductor device is slower than a predetermined value, the second control signal (slow) is activated by duty cycle detector 11, so that the data signal is applied to the gates of small-size second pull-up and pull-down transistors N11 and N13 through the NAND gates 12 and 14, and the inverters 16 and 18, to form an output signal from the output terminal.

Figure 6:
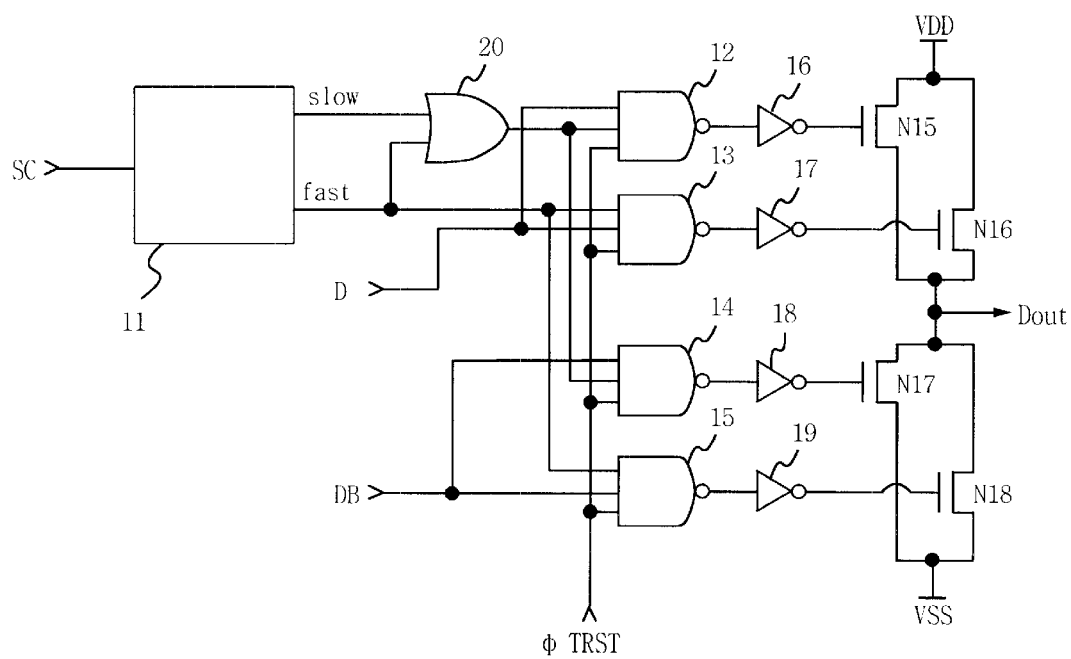
FIG. 6 is a circuit diagram of a duty cycle adaptive data output buffer according to a second embodiment of the present invention.

FIG. 6 shows the configuration of a data output buffer of a semiconductor device according to a second embodiment of the present invention. Referring to FIG. 6, the data output buffer includes first and second pull-up transistors N15 and N16 connected between a power supply voltage VDD and an output terminal Dout; first and second pull-down transistors N17 and N18 connected between output the terminal Dout and a ground VSS; and a duty cycle detector 11 for receiving a duty clock signal SC, to generate a first control signal (fast) at faster duty cycle, and to generate a second control signal (slow) at slower duty cycle. Furthermore, the data output buffer includes first output drivers 13, 17, 15 and 19 for driving the first pull-up and pull-down transistors N16 and N18 using first and second data signals D and DB in response to the first control signal (fast); and second output drivers 12, 16, 14, 18 and 20 for driving the second pull-up and pull-down transistors N15 and N17 using the first and second data signals D and DB in response to the first and second control signals.

In this embodiment, which is different than the first embodiment, the first and second pull-up and pull-down transistors have the same size, the second pull-up and pull-down transistors are operated in both cases where the duty cycle is slower and faster, and an OR gate 20 for ORing the first and second control signals is further included to the second output driver. The configuration of other parts is the same as that of the data output buffer according to the above-described first embodiment. Accordingly, in the second embodiment of the present invention, the data signal is output only by the second pull-up and pull-down transistors at slower duty cycle, but it is output by the first and second pull-up and pull-down transistors at faster duty cycle. Thus, the data signal is output rapidly when the duty cycle is fast, and the noise margin is improved when it is slow.

Figure 7:
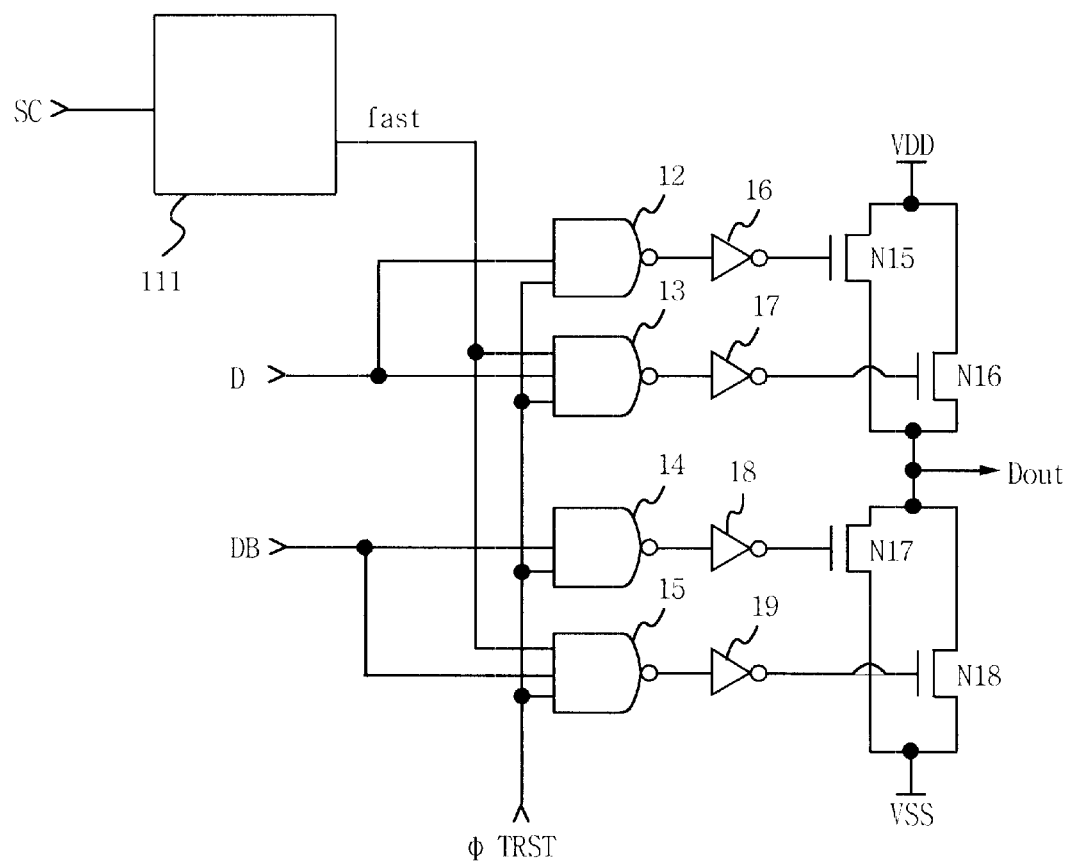
FIG. 7 is a circuit diagram of a duty cycle adaptive data output buffer according to a third embodiment of the present invention.

FIG. 7 shows the configuration of a data output buffer of a semiconductor device according to yet another embodiment of the present invention. Referring to FIG. 7, the data output buffer includes first and second pull-up transistors N15 and N16 connected between a power supply voltage VDD and an output terminal Dout; first and second pull-down transistors N17 and N18 connected between the output terminal Dout and a ground VSS; a duty cycle detector 111 for receiving a duty clock signal SC, to generate a first control signal (fast) when a duty cycle is faster than a predetermined normal duty cycle; first output drivers 13, 17, 15 and 19 for driving the first pull-up and pull-down transistors N16 and N18 using first and second data signals D and DB in response to the first control signal (fast); and second output drivers 12, 16, 14 and 18 for driving the second pull-up and pull-down transistors N15 and N17 using the first and second data signals D and DB.

The third embodiment has the same configuration as that of the first and second embodiments, except that the duty cycle detector generates only the first control signal, and the second output driver generates the output driving signal only by using a data signal and an output enable signal. Accordingly, the data output is determined by the second pull-up and pull-down transistors when the duty cycle is slower than the predetermined one, and it is determined by the first and second pull-up and pull-down transistors when the duty cycle is faster than the predetermined one. Thus, it is possible to satisfy the fast data access at fast duty cycle, and secure the noise margin at slow duty cycle.

According to the present invention, when a data output buffer is operated at lower frequency, an output driver whose size is smaller than that of an output driver required for higher frequency can be automatically selected through a duty cycle detector. As a result, it is possible to improve the noise margin at lower frequency and achieve high-speed access at higher frequency, by selectively determining the size of the output drivers according to the duty cycle. Other incremental variations on output driver size configured according to design requirements are also contemplated.

It will be apparent to those skilled in the art that various modifications and variations can be made in duty cycle adaptive data output buffer of the present invention without departing from the spirit or scope of the invention. Thus, it is intended that the present invention cover the modifications and variations of this invention provided they come within the scope of the appended claims and their equivalents.

What is claimed is:

1. A duty cycle adaptive data output buffer for use with a data buffer configured to operate at more than one frequency, the adaptive data buffer comprising:

a duty cycle detector configured to sense the operating frequency of the data buffer, and to generate a signal associated with the sensed frequency; and an output driver configured to receive the generated signal, and to change an output power of the output driver in accordance therewith.

2. The buffer of claim 1, wherein the output driver is a plurality of output driver components configured to operate independently in response to the generated signal.

3. The buffer of claim 1, wherein the output driver is a plurality of output driver components configured to operate simultaneously in response to the generated signal.

4. The buffer of claim 1, wherein the output driver is a plurality of output driver components of different sizes, and having output powers of different values.

5. The buffer of claim 1, wherein the output driver is a plurality of output driver components of substantially the same size, and having respective output powers of substantially the same values.

6. A method for operating a duty cycle adaptive data output buffer in connection with a data buffer which is configured to operate at more than one frequency, the method comprising the steps of:

sensing the operating frequency of the data buffer, and generating a signal associated with the sensed frequency; and receiving the generated signal, and changing an output power of an output driver in accordance therewith.

7. The method of claim 6, wherein the output driver is a plurality of output driver components configured to operate independently in response to the generated signal and wherein changing the output power includes activating at least one of the output driver components.

8. The method of claim 6, wherein the output driver includes a plurality of output driver components configured to operate simultaneously in response to the generated signal, and wherein changing the output power includes activating at least one of the output driver components.

* * * * *

UNITED STATES PATENT AND TRADEMARK OFFICE
CERTIFICATE OF CORRECTION

Figure 3:
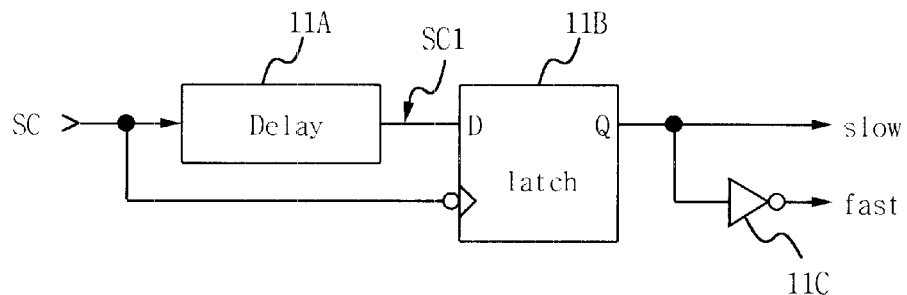
FIG. 3 shows an embodiment of the configuration of duty cycle detector of FIG. 2.

PATENT NO.     : 6,469,565 B1
DATED          : October 22, 2002
INVENTOR(S)    : Chul-kyu Lee It is certified that error appears in the above-identified patent and that said Letters Patent is hereby corrected as shown below:

Column 3,
Line 26, after "appropriate duty cycle" insert missing paragraph:

--      Referring to FIG. 3, a duty cycle detector 11 includes a delay 11A for delaying a duty clock signal SC by a predetermined time, a latch 11b for latching a signal SC1 delayed by the delay 11A at the following stage of the duty clock signal SC, and for outputting the latched signal as the second control signal (slow), and an inverter 11C for inverting the second control signal, to generate the first control signal (fast). --;
Line 37, "P1" should read -- P111 --;
Line 39, "N11" should read -- N111 --.

Signed and Sealed this

Twentieth Day of May, 2003

JAMES E. ROGAN
*Director of the United States Patent and Trademark Office*